United States Patent
Xiao et al.

(10) Patent No.: US 7,042,317 B2
(45) Date of Patent: May 9, 2006

(54) HIGH-FREQUENCY ACTIVE INDUCTOR

(75) Inventors: Haiqiao Xiao, Portland, OR (US); Rolf Schaumann, Portland, OR (US); W. Robert Daasch, Portland, OR (US)

(73) Assignee: State of Oregon, acting by and through the Board of Higher Education on behalf of Portland State University, Portland, OR (US)

( * ) Notice: Subject to any disclaimer, the term of this patent is extended or adjusted under 35 U.S.C. 154(b) by 15 days.

(21) Appl. No.: 10/937,062

(22) Filed: Sep. 8, 2004

(65) Prior Publication Data

US 2005/0083151 A1 Apr. 21, 2005

Related U.S. Application Data

(60) Provisional application No. 60/501,584, filed on Sep. 8, 2003.

(51) Int. Cl.
*H03H 11/00* (2006.01)
*H03F 3/45* (2006.01)
(52) U.S. Cl. .................. 333/214; 333/215; 330/257
(58) Field of Classification Search ............... 333/213, 333/214, 215; 330/253
See application file for complete search history.

(56) References Cited

U.S. PATENT DOCUMENTS

| | | | |
|---|---|---|---|
| 5,263,192 A * | 11/1993 | Mittel et al. | 455/313 |
| 5,635,880 A * | 6/1997 | Brown | 331/108 B |
| 6,028,496 A * | 2/2000 | Ko et al. | 333/214 |
| 6,211,753 B1 * | 4/2001 | Leifso et al. | 333/214 |
| 6,525,609 B1 | 2/2003 | Behzad | 330/254 |

OTHER PUBLICATIONS

Frank Op't Eynde, et al., "A Fully-Integrated Single-Chip SOC for Bluetooth," 2001 IEEE International Solid-State Circuits Conference, pp. 196-197.

Apinunt Thanachayanont and Alison Payne, "A 3-V RF CMOS Bandpass Amplifier Using an Active Inductor," 1998 IEEE International Symposium on Circuits and Systems (ISCAS 1998), vol. 1, pp. 440-443.

Apinunt Thanachayanont, "A 1.5-V High-Q CMOS Active Inductor for IF/RF Wireless Applications," 2000 IEEE Asia-Pacific Conference on Circuits and Systems (APCCAS 2000), pp. 654-657.

Apinunt Thanachayanont, "A 1.5-V CMOS Fully Differential Inductorless RF Bandpass Amplifier," 2001 IEEE International Symposium on Circuits and Systems (ISCAS 2001), pp. 49-52.

(Continued)

*Primary Examiner*—Dean Takaoka
(74) *Attorney, Agent, or Firm*—Stoel Rives LLP

(57) ABSTRACT

An active inductor circuit implemented in sub-micron CMOS semiconductor technology is usable at gigaHertz frequencies and includes an input node, a non-inverting transconductor circuit comprising a differential pair of NMOS transistors connected to the input node, an inverting transconductor circuit comprising an NMOS transistor connected to an output node of the non-inverting transconductor circuit and connected to the input node in a gyrator feedback configuration. Varactors coupled to the transconductor circuits tune the frequency and Q of the active inductor circuit.

30 Claims, 8 Drawing Sheets

OTHER PUBLICATIONS

Jhy-Neng Yang, et al., "A 1.75-GHz Inductor-less CMOS Low Noise Amplifier with High-Q Active Inductor Load," The 44th IEEE Midwest Symposium on Circuit and System, vol. 2, pp. 816-819, 2001.

Chao-Chih Hsiao, et al., "Improved Quality-Factor of 0.18-um CMOS Active Inductor by a Feedback Resistance Design," IEEE Microwave and Wireless Components Letter, vol. 12, No. 12, Dec. 2002.

Y. Yodprasit and J. Ngarmnil, "Q-Enhancing Technique for RF CMOS Active Inductor," 2000 IEEE International Symposium on Circuits and Systems (ISCAS 2000), vol. 5, pp. 589-592.

Apinunt Thanachayanont and S. Sae Ngow, "Class AB VHF CMOS Active Inductor," The 45th Midwest Symposium on Circuits and Systems, vol. 1, pp. 64-67, 2002.

Choon Haw Leong and Gordon W. Roberts, "A Sixth-Order UHF Bandpass Filter Using Silicon Bipolar Active Inductors," 1998 IEEE International Symposium on Circuits and Systems (ISCAS 1998), vol. 1, pp. 127-130.

Yue Wu, Mohammed Ismail, Hakan Olsson, "A Novel CMOS Fully Differential Inductorless RF Bandpass Filter," 2000 IEEE International Symposium on Circuits and Systems (ISCAS 2000), vol. 4, 149-152.

Markus Grozing, Andreas Pascht, Manfred Berroth, "A 2.5 V CMOS Differential Active Inductor with Tunable L and Q for Frequencies up to 5 GHz," 2000 IEEE Radio Frequency Integrated Circuits (RFIC) Symposium, pp. 271, 274.

R. Akbari-Dilmaghani, A. Payne and C. Toumazou, "A High Q RF CMOS Differential Active Inductor," 1998 IEEE International Conference on Electronics, Circuits and Systems (ICECS) 1998), vol. 3 pp. 157-160.

K.H. Chiang, et al., "A Modular Approach for High Q Microwave CMOS Active Inductor Design," The 7th IEEE International Conference on Electronics, Circuits and Systems (ICECS 2000), vol. 1, pp. 41-44.

Aydin Karsilayan and Rolf Schaumann, "A High-Frequency High-Q CMOS Active Inductor with DC Bias Control," The 43rd IEEE Midwest Symposium on Circuits and Systems, pp. 486-489, 2000.

Haiqiao Xiao and Rolf Schaumann, "Very-High-Frequency Lowpass Filter Based on a CMOS Active Inductor," 2002 IEEE International Symposium on Circuits and Systems (ISCAS 2002), vol. 2, 2002, pp. 1-4.

Haiqiao Xiao and Rolf Schaumann, "A Low-Voltage Low-Power CMOS 5-GHz Oscillator Based on Active Inductors," 9th IEEE International Conference on Electronics, Circuits and Systems (ICECS 2002), Dubrovnik, Croatia, Sep. 2002.

* cited by examiner

HIGH-FREQUENCY ACTIVE INDUCTOR

RELATED APPLICATION

This application claims the benefit of U.S. Provisional Application No. 60/501,584, filed Sep. 8, 2003, which is incorporated herein by reference.

FEDERALLY SPONSORED RESEARCH OR DEVELOPMENT

Not applicable.

TECHNICAL FIELD

This application relates to the field of electronic circuits and, in particular, to integrated circuit (IC) methods and circuits for implementing active inductors.

BACKGROUND OF THE INVENTION

An integrated inductor capable of operating at gigaHertz ($10^9$ Hz) frequencies is a critical element in, e.g., oscillators, filters, and wide-band low-noise amplifiers (LNAs). The main applications are radio-frequency (RF) communication and high-speed data processing ICs, such as those in cellular phones, wireless network cards, and broadband transceivers.

Integrated inductors may be classified as passive or active. Most passive integrated inductors are implemented by metal wires in spiral form, hence the name "spiral inductors." Other passive integrated inductors employ a piece of bondwire or micromachined conductor structures. Active integrated inductors, on the other hand, are implemented with electronic circuits that employ transistors and capacitors to achieve an inductive input impedance. Active inductors have been gaining increasing attention because, although noisier, they occupy a much smaller semiconductor die area (as little as 2–10% of that of passive inductors), can be designed to have a larger inductance values, high quality factors (Q), and are electronically tunable.

There are two fundamental approaches to realizing an active inductor using only capacitors and active gain elements. One is an operational-amplifier (opamp) method, which can be used to design active inductors operating at moderate frequencies (up to about 100 MHz), because of the limited bandwidth and excessive phase shift of the opamps. FIG. 1A shows the other approach that employs a gyrator 10; which is the method used by almost all active inductors operating at gigaHertz (gHz) frequencies.

Gyrator 10 typically includes two transconductors 12 and 14 (voltage-to-current converters) connected in a negative feedback loop as shown in FIG. 1A. Each of transconductors 12 and 14, ($g_{m1}$ and $g_{m2}$), provides an output current proportional to the difference between the input voltages of transconductors 12 and 14, $I_{out}=g_m(V_{in+}-V_{in-})$. The input impedance of gyrator 10 acts as a lossless inductor if both $g_{m1}$ and $g_{m2}$ are ideal:

$$Z_{in} = s\frac{C_L}{g_{m1}g_{m2}} = sL_{eq} \tag{1}$$

In real circuit implementations, both $g_{m1}$ and $g_{m2}$ have non-zero output conductances, $g_{o1}$, $g_{o2}$, and parasitic input and output capacitances. $g_{o1}$ and $g_{o2}$ will make the active inductor lossy and reduce the quality factor, Q. Some of the parasitic capacitances can be merged with (added to) $C_L$, increasing the equivalent inductance $L_{eq}$, while other capacitances will appear at the input terminal as $C_1$, making the active inductor a resonator with a resonance frequency as represented by Eq. 2.

$$f_R = \frac{1}{2\pi\sqrt{L_{eq}C_1}} = \frac{1}{2\pi}\sqrt{\frac{g_{m1}g_{m2}}{C_L C_1}} \tag{2}$$

FIG. 1B shows the equivalent circuit of gyrator 10, where $R_p$ represents an equivalent loss resistor, combining all the losses in gyrator 10. Below $f_R$, the input impedance $Z_{in}$ is inductive; above $f_R$, $Z_{in}$ is capacitive; at resonance, $f=f_R$, $Z_{in}$ is resistive ($Z_{in}=R_p$). There are typically two ways of applying an active inductor in RF circuit designs: as an inductor, when the application frequency f is less than $f_R$, $f<f_R$, and as a resonator, when f is around $f_R$. The useable frequency range of the active inductor is, therefore, from near dc to $f_R$. To operate the inductor at a frequency f in the gigaHertz range, $f_R$ needs to be higher than f, $f_R>f$. To maximize $f_R$, according to Eq. 2, $g_{mi}$ can be increased at the cost of increased power consumption and/or $C_L$ and $C_1$ can be reduced to only the unavoidable parasitic capacitors, such as the gate-source capacitance ($C_{gs}$), the drain-diffusion capacitance ($C_{jd}$), and interconnect capacitances. The multiple-transistor transconductors with linearization employed in transconductor-capacitor ($G_m$-C) filters can not generally be used here, because their internal nodes generate parasitic poles, which increase the phase shift of the transconductors and severely reduce their useable frequency range. Therefore, transconductors with single or minimum-count transistors should be employed.

Prior integrated active inductors and their applications have been implemented in various IC fabrication technologies [1–16], such as Complementary Metal Oxide Semiconductor (CMOS), Bipolar, and Gallium-Arsenide (GaAs). CMOS is the preferred technology because of its low cost and compatibility with digital circuits. Modern submicron CMOS technology having a minimum transistor length L less than 1 µm brings quite a few challenges to active inductor designers. Among them: the transistors are intrinsically very lossy because of the short-channel effect, the supply voltage is low ($\leq 1.8$ V), the threshold voltages ($V_T$s) are relatively high (0.5–0.7 V), and metal-insulator-metal (MiM) capacitors are not available in standard digital CMOS technologies.

Prior workers have employed various methods for constructing active inductors. Representative prior art references are discussed briefly below. Almost all gigaHertz active inductors are built on the principle of gyration, using transconductors with only single or minimum-count transistors. However, subject to the constraints of dc biasing and device characteristics, prior methods for constructing CMOS active inductors are very limited.

FIG. 2A shows a regulated cascode structure 20 that is employed by a large proportion of prior active inductor implementations [1–8]. FIG. 2B shows the small-signal equivalent circuit of cascode structure 20 with components defined as $$C_1=C_{gs2}+C_{js1}, C_2=C_{jd,IB}+C_{jd2}+C_L, g_1=g_{ds1}, g_2=g_{ds2}+g_{ds,IB}$$

where $C_{gs1}$, $C_{gs2}$ are the gate-source capacitances of transistors $M_1$ and $M_2$, respectively;

$C_{js1}$ is the source diffusion capacitance of $M_1$;

$C_{jd2}$, $C_{jd,IB}$ are the drain diffusion capacitances of $M_2$ and $M_{IB}$, respectively;

$C_L$ is the load capacitor (if it exists); and $g_{ds1}$, $g_{ds2}$, $g_{ds,IB}$ are the drain-source conductances of $M_1$, $M_2$, and $M_{IB}$, respectively.

The input impedance $Z_{in}$ of regulated cascode circuit 20 is $$Z_{in}(s) = \frac{V_1}{I_1} = \frac{s(C_2 + C_{gs1}) + g_2}{D(s)} = \frac{1}{Y_{in}(s)} \quad (3a)$$

with $$D(s) = s^2[C_1(C_2+C_{gs1})+C_2 C_{gs1}]+s[(g_{m1}+g_1)(C_2+C_{gs1})+(C_1+C_{gs1})g_2+C_{gs1}(g_{m2}-g_{m1})]+g_{m1}g_{m2}+(g_{m1}+g_1)g_2 \quad (3b)$$

$Z_{in}$ is resonant and is equivalent to that of the R-L-C parallel circuit shown in FIG. 2C:

$$Y_{in} = sC_p + g_p + \frac{1}{sL_{eq} + r_{loss}} \quad (4a)$$

with, approximately, $$C_p = C_1 + \frac{C_2 C_{gs1}}{C_2 + C_{gs1}},$$

$$g_p = g_1 + g_{m1} + \frac{C_{gs1}(C_{gs1}+C_2)(g_{m2}-g_{m1}) + C_{gs1}^2 g_2}{(C_2 + C_{gs1})^2}$$

$$L \approx \frac{(C_2 + C_{gs1})}{(g_{m1}g_{m2})}, \quad r_{loss} \approx \frac{g_2}{(g_{m1}g_{m2})}$$

The approximations are made assuming that $g_1 \approx g_2 << |s(C_2+C_{gs1})|$, $g_{m1} \approx g_{m2}$. Regulated cascode circuit 20 is, however, an intrinsically low-Q circuit, because the input resistance at the source of $M_1$ at Node 1 (FIG. 2A) is $1/g_{m1}$, which has a very low value. $M_1$ serves as the non-inverting transconductor within the gyrator, but is not very efficient because of its common-drain arrangement.

To improve the Q, prior workers [2, 5–7] have employed an alternative cascode approach by adding cascode transistors on the drain of $M_2$. However, this reduces the dynamic range of the circuit, and may be impossible to implement in low-voltage submicron technology. Other prior workers [3, 4, 8] have added negative resistors to compensate for the active-inductor loss, which reduces the maximum operating frequency and increases the noise.

Yet other workers [10] have described a simple CMOS active inductor structure employing feedback within the cascode circuit. However, this approach also has an intrinsically low-Q because a node between the two transistors is connected to the source of the top NMOS device and has very low impedance. A negative resistor is added to the circuit to enhance Q, but this undermines the frequency benefits that the simple structure may offer. Nonetheless, the regulated cascode circuit 20 active inductor and the circuit of [10] may be used to implement wide-band amplifiers and low-pass filters with potentially high performances, where high Q is not required.

Other prior workers [11–13] describe active inductor gyrator structures by connecting two differential transconductance amplifiers back to back. To enhance the Q, some workers use negative resistors [11], and other designers add series resistors in the feedback paths [12]. As a result, the final circuits are complex and the maximum operating frequency is reduced.

Karsilayan and Schaumann [14] describe a high-Q active inductor structure for implementing lowpass filters [15] and oscillators[16]. The signal path includes only three devices, two PMOS transistors and one NMOS transistor. Karsilayan's circuit overcomes most of the aforementioned disadvantages and operates up to 5 gHz in simulation (for 0.2 micron technology) and 4 gHz in experiment.

While working-around and solving some of the above-described problems, the prior active inductor structures using submicron CMOS technologies nevertheless exhibit several disadvantages:

a. The number of transistors employed in the prior circuits is typically large (four to nine or greater), and the operating frequency is limited to 1–2 gHz with submicron fabrication technologies, because the signal path contains too many nodes and hence multiple parasitic poles. The parasitic poles also make the impedance function more complex and the inductor harder to calibrate.

b. The signal path is a mixture of N-type MOS (NMOS) and P-type MOS (PMOS) transistors. The mobility of NMOS ($\mu_n$) in submicron technologies is 4 to 5 times that of PMOS ($\mu_p$), and the transconductance of MOS transistors (MOSFETs) is proportional to their mobility. Therefore, the maximum operating frequency of the active inductor is limited by the PMOS transistors.

c. Most prior structures have an intrinsically low Q, and must employ cascode structures or negative resistors to enhance Q to implement circuits, such as narrow-band bandpass filters. The negative resistor increases the noise and parasitic capacitance of the circuit. The cascode structure limits the dynamic range and is not compatible with low-voltage ($\leq 1.8$ V) operation. To reduce the circuit loss in these structures, the transistor lengths are usually 2–3 times the technology minimum, so that the high-speed advantage of submicron technology cannot be fully exploited. Generally, all three practices significantly reduce the maximum operating frequency.

d. Many prior designs employ costly modified CMOS technologies to derive components normally not available in standard digital CMOS technologies, such as MiM capacitors, or to enhance the characteristics of CMOS transistors, such as lowering $V_T$.

What is still needed, therefore, is a active inductor structure that solves the above-described problems.

SUMMARY

It is an object of this invention, therefore, to provide an apparatus and a method for making an active inductor circuit that overcomes the disadvantages of the prior art.

Another object of this invention is to provide a method for making an active inductor circuit with sub-micron NMOS IC technology.

Yet another object of this invention is to implement and test representative circuits employing the active inductor circuit of this invention.

A further object of this invention is to provide an apparatus and a method for making an active inductor circuit operable at frequencies greater than 2 gHz.

Still another object of this invention is to provide an apparatus and a method for providing an active inductor circuit having tunable parameters.

An active inductor circuit of this invention is preferably implemented with sub-micron NMOS IC technology. FIGS. 3A and 3B show, respectively, a simplified equivalent circuit 30 and an all-NMOS preferred embodiment of an active inductor circuit 32 of this invention. In FIG. 3A, current sources $I_F$, $I_S$, and $I_S/2$ are dc bias currents that are implemented as shown in FIG. 3B by transistors $M_{IF}$, $M_{IS}$ and $M_{IS/2}$. Transistors $M_{IF}$, $M_{IS}$ and $M_{IS/2}$ are biased by appropriate dc voltages to implement the three required current sources. A common mode voltage $V_{CM}$ carries no signal. Varactors $M_F$ and $M_Q$ are employed to tune the frequency and Q of active inductor circuit 32 as explained later.

A differential pair of transistors $M_1$ and $M_2$ corresponds to the non-inverting transconductor $g_{m1}$ 12 of FIG. 1A, and a transistor $M_3$ corresponds to the inverting transconductor $g_{m2}$ 14 of FIG. 1A. The signal path propagates through nodes 1, 2, and 3, and preferably includes only NMOS transistors. In accordance with Eq. (1), the parasitic capacitance at node 3 is gyrated to form an inductance by transistors $M_1$, $M_2$, and $M_3$. The inductance and parasitic capacitance at node 1 form a resonator, having the resonance frequency $f_R$ shown in Eq. (2). Node 2 has an advantageous parasitic capacitor that, as described below, can be used to compensate for the large output conductance (source-drain leakage $g_{ds}$) of submicron MOSFETs that cause the gyrator to be lossy. Therefore, structure of active inductor circuit 32 is very efficient.

Active inductor circuit 32 of this invention is advantageous because it employs only three NMOS transistors in its signal path to increase the maximum operating frequency by 40%, up to 7 gHz (for 0.2 micron technology) in simulation and 5.7 gHz in experiment. This high-frequency performance is possible because the mobility of NMOS is four to five times greater than PMOS in submicron CMOS technologies.

Additional aspects and advantages will be apparent from the following detailed description of preferred embodiments, which proceeds with reference to the accompanying drawings.

DETAILED DESCRIPTION OF PREFERRED EMBODIMENTS

Figure 4A:
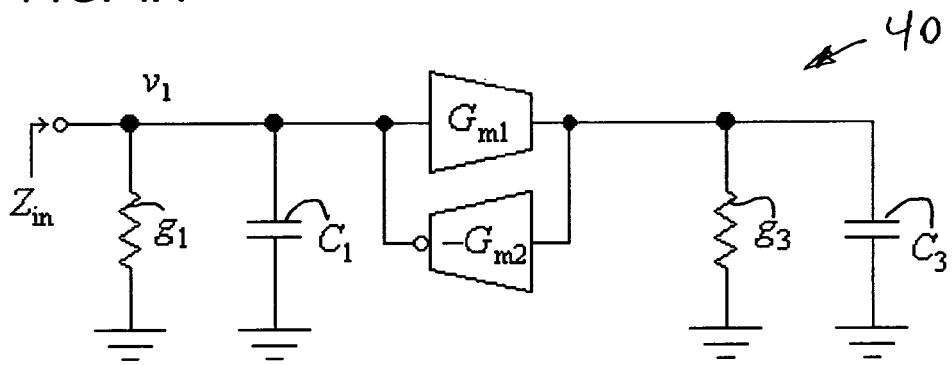
FIGS. 4A and 4B are schematic electrical diagrams representing respectively the small-signal equivalent circuits of the NMOS active inductor circuit and of the transconductor $G_{m1}$ in FIG. 4A.
Figure 4B:
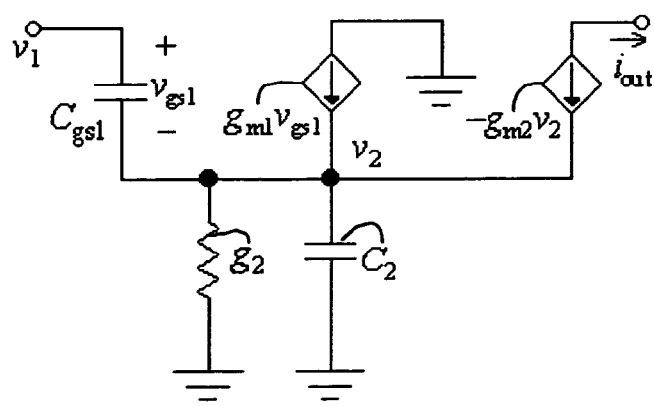

Referring to FIGS. 4A and 4B, a mathematical small-signal analysis is set forth below to demonstrate the performance of active inductor circuit 32. FIG. 4A shows a small-signal equivalent circuit 40 of active inductor circuit 32. A conductance $g_1$ represents the sum of drain-source leakage $g_{ds}$ from $M_3$ and $M_{IF}$, and a conductance $g_3$ represents primarily the drain-source leakage $g_{ds}$ of $M_{IS/2}$. A capacitor $C_1 \approx 0.5C_{gs1} + C_{jd3} + C_{jd,IF} + C_L$, where $C_{jd,IF}$ represents the drain diffusion capacitance of transistor $M_{IF}$, and $C_L$ represents the load capacitance (including the input capacitance of any subsequent circuitry). A capacitor $C_3 \approx C_{gs3} + C_{jd2} + C_{jd,IS/2}$, where $C_{jd,IS/2}$ is the drain-diffusion capacitance of transistor $M_{IS/2}$. A transconductor $G_{m2} = g_{m3}$, the transconductance of transistor $M_3$. A transconductor $G_{m1}$ has an internal node, and its small-signal equivalent circuit 42 is represented by FIG. 4B.

In FIG. 4B, a conductance $g_2 \approx g_{ds,IS} + g_{ds1}$, where $g_{ds,IS}$ is the $g_{ds}$ of transistor $M_{IS}$. A capacitor $C_2 = C_{jd,IS} + C_{gs2} + C_{js1} + C_{js2}$, where $C_{jd,IS}$ is the drain diffusion capacitance of transistor $M_{IS}$, and $C_{js1}$ and $C_{js2}$ are the source diffusion capacitances of transistors $M_1$ and $M_2$, respectively. Transconductors $g_{m1}$ and $g_{m2}$ are the transconductances of transistors $M_1$ and $M_2$, respectively. The $g_{ds}$ of transistor $M_2$ has been ignored because it is much smaller than $g_{ds,IS}$. Because of $C_{gs1}$ and $C_2$, transconductance $G_{m1}$ is a function of the complex frequency s.

The circuit equations for FIG. 4B are $$V_2(g_2 + sC_2 + sC_{gs1}) = V_1 sC_{gs1} + g_{m1} V_{gs1} - g_{m2} V_2 = V_1 sC_{gs1} + g_{m1}(V_1 - V_2) - g_{m2} V_2 \quad (5a)$$

$$I_{out} = g_{m2} V_2 \quad (5b)$$

from which we solve $$G_{m1}(s) = \frac{I_{out}}{V_1} = \frac{g_{m2}(sC_{gs1} + g_{m1})}{s(C_{gs1} + C_2) + g_{m1} + g_{m2} + g_2} \quad (6)$$

whose pole frequency $$\omega_{p1} = \frac{G}{C_2'} = \frac{g_{m1} + g_{m2} + g_2}{C_{gs1} + C_2} = \frac{g_{m1}}{C_{gs1}} \frac{1 + (g_{m2} + g_2)/g_{m1}}{1 + C_2/C_{gs1}} \quad (7)$$

is less than its zero frequency $$\omega_{z1} = g_{m1}/C_{gs1} \quad (8)$$

because $C_2 > C_{gs2} \approx C_{gs1}$, since $M_1$ and $M_2$ in FIG. 3 have the same physical size and biasing. We labeled $$C'_2 = C_{gs1} + C_2, G = g_{m1} + g_{m2} + g_2 \quad (9a,b)$$

Therefore, $G_{m1}(s)$ is expected to have a phase lag at an operating frequency $f_{op}$, because $f_{op} \leq f_R < g_{m1}/(2\pi C_{gs1})$. The frequency $f_{z1} = g_{m1}/(2\pi C_{gs1})$ represents the upper bound of a given fabrication technology for designing active inductors. It can usually not be reached because of other parasitic capacitors, such as the source/drain diffusion capacitance and interconnect capacitances. The pole at the frequency $$f_{p1} = \omega_{p1}/(2\pi) >> f_{op} \quad (10)$$

is non-dominant. At the frequency $f_{op} < g_{m1}/(2\pi C_{gs1})$, $|sC_{gs1}| << g_{m1}$. In a properly designed circuit $g_2 << g_{m1} \approx g_{m2}$; therefore $G_{m1}(s)$ is approximately $$G_{m1}(s) \approx \frac{g_{m1}g_{m2}}{sC'_2 + g_{m1} + g_{m2}} \approx \frac{0.5 g_{m1}}{1 + s/\omega_{p1}} \quad (11)$$

Applying the above results to small-signal equivalent circuit 40 of FIG. 4A, the circuit equations are $$V_3 = \frac{G_{m1}(s)V_1}{g_3 + sC_3} \approx \frac{0.5 g_{m1}}{(1 + s/\omega_{p1})(g_3 + sC_3)} V_1 \quad (12a)$$

$$V_1 = \frac{I_1 - G_{m2}(s)V_3}{g_1 + sC_1} = \frac{I_1 - g_{m3}V_3}{g_1 + sC_1} \quad (12b)$$

Solving for the input admittance:

$$Y_{in} = \frac{I_1}{V_1} \quad (13)$$

$$= g_1 + sC_1 + \frac{0.5 g_{m1}g_{m3}}{(1 + s/\omega_{p1})(g_3 + sC_3)}$$

$$= g_1 + sC_1 + Y'_{in}$$

Replacing s by $j\omega$, $$Z'_{in} = \frac{1}{Y'_{in}} \quad (14)$$

$$= j\omega \frac{C_3 + g_3/\omega_{p1}}{0.5 g_{m1}g_{m3}} + \frac{g_3 - \omega^2 C_3/\omega_{p1}}{0.5 g_{m1}g_{m3}}$$

$$\approx j\omega \frac{C_3}{0.5 g_{m1}g_{m3}} + \frac{g_3 - \omega^2 C_3/\omega_{p1}}{0.5 g_{m1}g_{m3}}$$

$$= j\omega L_{eq} + r_{loss}(\omega)$$

with $$L_{eq} = \frac{C_3}{0.5 g_{m1}g_{m3}}, \quad r_{loss}(\omega) = \frac{g_3 - \omega^2 C_3/\omega_{p1}}{0.5 g_{m1}g_{m3}} \quad (15a,b)$$

Figure 5:
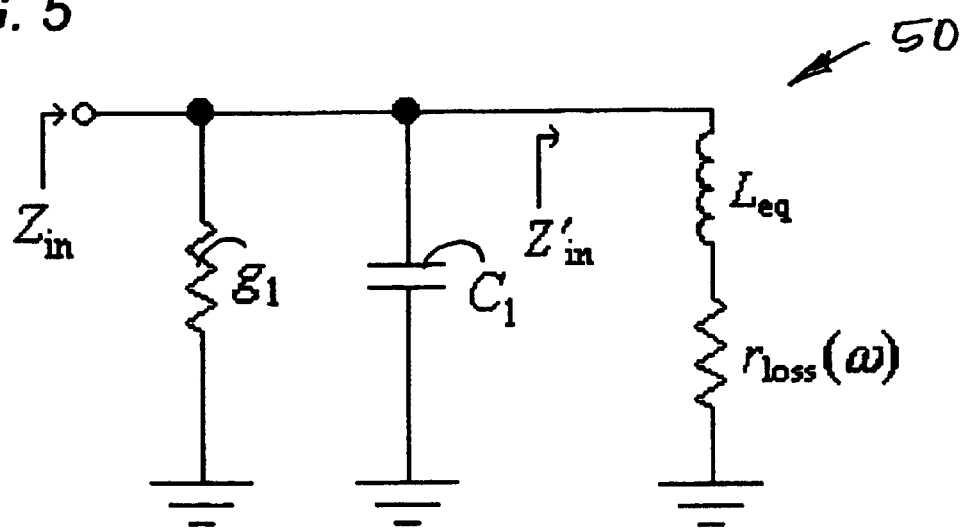
FIG. 5 is a schematic electrical diagram representing the equivalent circuit for the input impedance $Z_{in}$ of the active inductor circuit of FIG. 4.

FIG. 5 shows an equivalent circuit 50 representing the input impedance $Z_{in}$ of active inductor circuit 32. Conductance $g_1$ and capacitance $C_1$ are the same as represented in equivalent circuit 40 of FIG. 4A, but capacitor $C_3$ and conductance $g_3$ of FIG. 4A are gyrated into a lossy inductance by transistors $M_1$ to $M_3$. The loss term is a function of the pole frequency $\omega_{p1}$. Treating $g_1$ and $C_1$ as extrinsic, the Q of the inductor $L_{eq}$ with loss $r_{loss}(\omega)$ is represented by $$Q_L(\omega) = \frac{\omega L_{eq}}{r_{loss}(\omega)} = \frac{\omega C_3}{g_3 - \omega^2 C_3/\omega_{p1}} = \frac{\omega C_3}{g_3 - \omega^2 C_3 C'_2/G} \quad (16)$$

Increasing the phase lag of $G_{m1}$ in FIG. 4A, i.e., decreasing $\omega_{p1}$, the negative term $\omega^2 C_3/\omega_{p1}$ in $r_{loss}(\omega)$ increases and partially cancels the circuit loss term $g_3$. If $\omega_{p1} = \omega_{op}^2 C_3/g_3$ at a particular operating frequency $\omega_{op}$, the inductance can be lossless, and $Q_L = \infty$. As shown below, $\omega_{p1}$ can indeed be decreased to fully compensate also for $g_1$ and make active inductor circuit 32 lossless.

Because most RF applications are narrow-band (i.e., the ratio of bandwidth, BW, to center frequency, $\omega_0$, is much less than 1, $BW/\omega_0 << 1$), when designing an active inductor, workers should concentrate on the range of frequencies surrounding the frequency $f_0$ and not on the $Q_L$ variations within that range.

After the circuit operation and loss compensation are understood, a more complete small-signal analysis may be performed. Substituting Eq. (14) in Eq. (13):

$$Z_{in} = \frac{V_1}{I_1} \quad (17)$$

$$= \frac{(sC'_2 + G)(sC_3 + g_3)}{s^3 C_1 C'_2 C_3 + s^2(GC_1 C_3 + g_1 C'_2 C_3 + g_3 C_1 C'_2) + s[G(g_1 C_3 + g_3 C_1) + g_1 g_3 C'_2] + 0.5 g_{m1}g_{m3}G + Gg_1 g_3}$$

Replacing $s^3$ by $-\omega^2 S$, and dividing the numerator and denominator by $GC_1 C_3$:

$$Z_{in}(s) = \frac{(1 + sC'_2/G)(s + g_3/C_3)/C_1}{s^2\left(1 + \frac{g_1 C'_2}{GC_1} + \frac{g_3 C'_2}{GC_3}\right) + s\left(\frac{g_1}{C_1} + \frac{g_3}{C_3} + \frac{g_1 g_3 C'_2}{GC_1 C_3} - \omega^2 \frac{C'_2}{G}\right) + \frac{0.5 g_{m1}g_{m3} + g_1 g_3}{C_1 C_3}} \quad (18)$$

In accordance with Eq. (10) and within the operating frequency range:

$$|sC'_2/G| << 1 \quad (19)$$

Because $g_i$, $i = 1, 2, 3$ are parasitics, at frequencies far above dc and close to the self-resonance frequency $f_R$:

$$|s| >> g_3/C_3, g_1/G << 1, g_3/G << 1, g_1 g_3 << 0.5 g_{m1}g_{m3} \quad (20)$$

Applying Eqs. (19) and (20) to Eq. (18), considering $C'_2$ is of the same order as $C_1$ and $C_3$, the approximate total input impedance is:

$$Z_{in}(s) \approx \frac{s/C_1}{s^2 + s\left(\frac{g_1}{C_1} + \frac{g_3}{C_3} + \frac{g_1 g_3 C'_2}{GC_1 C_3} - \omega^2 \frac{C'_2}{G}\right) + \frac{0.5 g_{m1}g_{m3}}{C_1 C_3}} \quad (21)$$

which represents a second-order active inductor resonator and is equivalent to an R-L-C parallel circuit.

The pole (self-resonance) frequency is $$\omega_R = \sqrt{0.5 g_{m1} g_{m3}/(C_1 C_3)} \quad (22)$$

with the Q at $\omega = \omega_R$ $$Q_R = \frac{\sqrt{0.5 g_{m1} g_{m3}/(C_1 C_3)}}{\frac{g_1}{C_1} + \frac{g_3}{C_3} + \frac{g_1 g_3 C_2'}{G C_1 C_3} - \omega_R^2 \frac{C_2'}{G}} \quad (23)$$

$$= \frac{\sqrt{0.5 g_{m1} g_{m3}/(C_1 C_3)}}{\frac{g_1}{C_1} + \frac{g_3}{C_3} - \frac{C_2'}{G}\left(\omega_R^2 - \frac{g_1 g_3}{C_1 C_3}\right)}$$

The positive terms in the denominator of $Q_R$ represent the intrinsic loss of the circuit, and the negative term represents the compensation effected through $C_2'$. Since $g_1$ and $g_3$ are parasitics and very small:

$$\omega_R > \sqrt{\frac{g_1 g_3}{C_1 C_3}} \quad \text{or} \quad (24)$$

$$\omega_R^2 - \frac{g_1 g_3}{C_1 C_3} = \frac{0.5 g_{m1} g_{m3} - g_1 g_3}{C_1 C_3} \approx \frac{g_{m1} g_{m3}}{2 C_1 C_3} > 0$$

Evidently, increasing $C_2'$ increases $Q_R$. When $$C_2' = \left(\frac{g_1}{C_1} + \frac{g_3}{C_3}\right)\frac{G}{\omega_R^2 - g_1 g_3/(C_1 C_3)} \approx \left(\frac{g_1}{C_1} + \frac{g_3}{C_3}\right)\frac{G}{\omega_R^2} \quad (25)$$

$Q_R$ is infinite. Although $Q_R$ can be infinite, this not preferred because the circuit will self-oscillate. This nevertheless indicates that with the active inductor structure of this invention, there is no upper limit to $Q_R$. Evidently, $C_2'$ can compensate not only $g_3$ as shown by Eq. (15b), but also $g_1$ and $g_2$.

The two above-described small-signal analysis approaches are equivalent in that $L_{eq}$ is related to $f_R$, and $Q_L$ is related to $Q_R$. The first approach is preferred when active inductor circuit 32 is employed as an inductor, with operating frequency $f_{op} < f_R$. The second approach is preferred when active inductor circuit 32 is employed as a resonator, with $f_{op} = f_R$.

Tuning or calibrating active inductor circuit 32 is carried out as follows. The equations for the equivalent inductance $L_{eq}$, inductor quality factor $Q_L$, self-resonance frequency $f_R$, and resonator quality factor $Q_R$ were given above, and the equations may be used to design for specific parameter values. However, IC fabrication is fairly inaccurate due to process variations and tolerances. Design parameters, such as $g_m$ and $C_{gs}$, may exhibit 20–50% or even larger variations. Therefore, measures must be made available to tune the active inductor to given specifications, i.e., "tuning handles" should be provided to control the performance parameters.

Referring again to FIG. 3B, the two PMOS variable capacitors (varactors) $M_F$ and $M_Q$ perform the tuning function. The substrate (backgates) of the PMOS varactors $M_F$ and $M_Q$ are connected to biasing voltage $V_F$ and $V_Q$, respectively. When the bias voltages are decreased the gate capacitance $C_{gg}$ of the varactors increases, and vice versa. $V_F$ and $V_Q$ control the values of capacitors $C_3$ and $C_2$ of FIGS. 4A and 4B, respectively.

The available tuning handles include:
a. Bias current $I_F$: Tuning $I_F$ changes the value of $g_{m3}$, and changes the equivalent inductance $L_{eq}$ (Eq. 15) and self-resonance frequency $f_R$ (Eq. 22).
b. Bias current $I_S$: Tuning $I_S$ changes the value of $g_{m1}$ and $g_{m2}$ simultaneously, and changes G (Eq. 9). Per Eqs. (16) and (23), this can tune the inductor quality factor $Q_L$ and resonator quality factor $Q_R$.
c. Bias voltage $V_F$: Per Eqs. (15) and (22), tuning $V_F$ changes capacitor $C_3$, and further changes $L_{eq}$ and $f_R$.
d. Bias voltage $V_Q$: Per Eqs. (16) and (23), tuning $V_F$ changes capacitor $C_2'$ and further changes $Q_L$ and $Q_R$.

Due to the circuit parasitics, the tuning is not completely orthogonal, i.e., tuning $L_{eq}$ and $f_R$ does affect $Q_L$ and $Q_R$ and vice versa. But as shown by the equations, they are independent to a large extent, and hence acceptable in most applications.

The bias-current tuning should be used for "coarse tuning" as it can change the circuit parameters over a very wide range. Tuning via the varactor-bias voltages should be used for "fine tuning" as its tuning ranges are smaller, but can be accomplished with higher precision.

Experimental verification of the active inductor circuit performance was carried out as set forth below. A number of application modules using the active inductor were designed and fabricated in the Taiwan Semiconductor Manufacturing Company (TSMC) employing 0.18-μm standard digital CMOS process (CL018). The minimum transistor length is 0.20 μm, restricted by the process design kit. The application modules implement sinusoidal oscillators, second-order high-Q bandpass filters, and second-order lowpass filters, all operable up to the middle gigaHertz range.

The IC test chips were probed with a Cascade Microtech® microwave probe station, to route gigaHertz signals in and out of the test chip. The modules are measured with a Hewlett-Packard® (HP) 8593E Spectrum Analyzer, an HP-8722ES Vector Network Analyzer (VNA), and a Tektronix® 11801B High-Speed Digital Sampling Oscilloscope.

The main experiment results are set forth below.

Figure 6A:
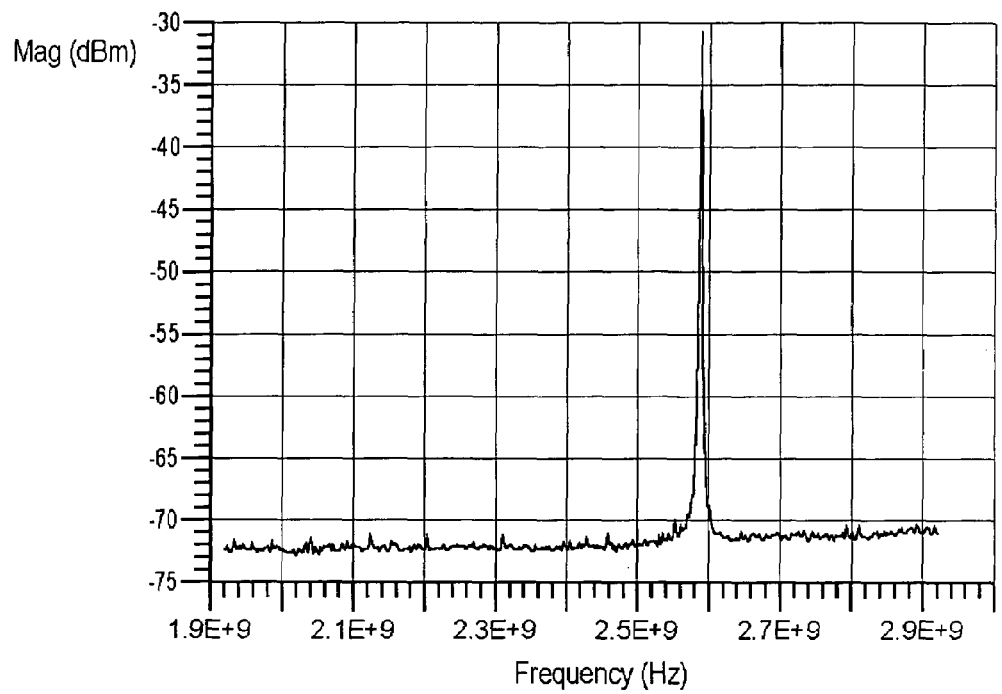
FIGS. 6A and 6B are graphs representing respectively fundamental and second harmonic output spectrums of a 2.6-gHz oscillator implemented with the active inductor circuit of this invention.
Figure 6B:
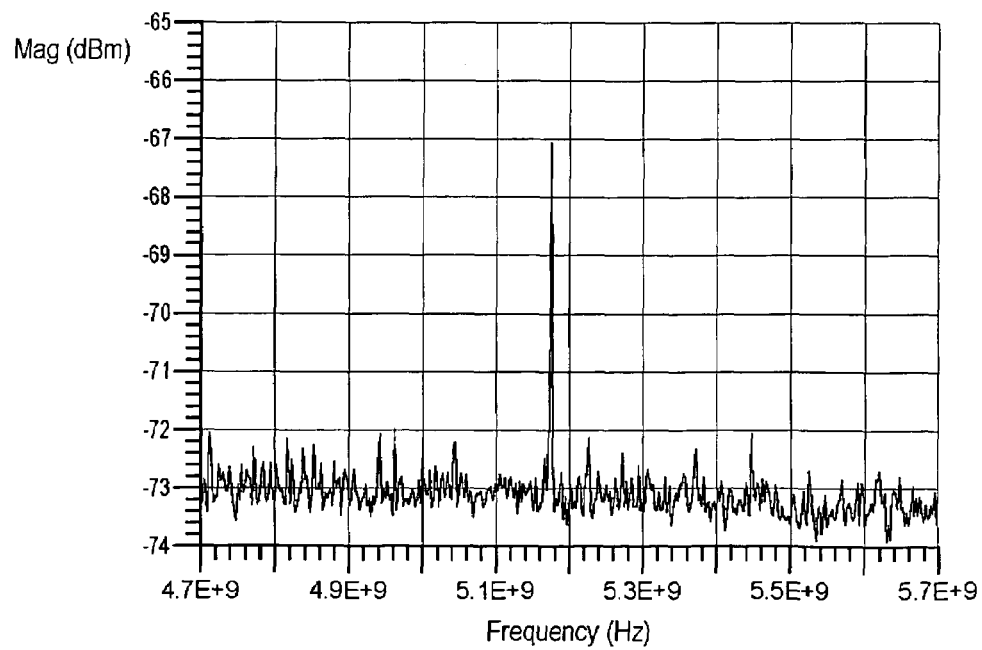
Figure 7:
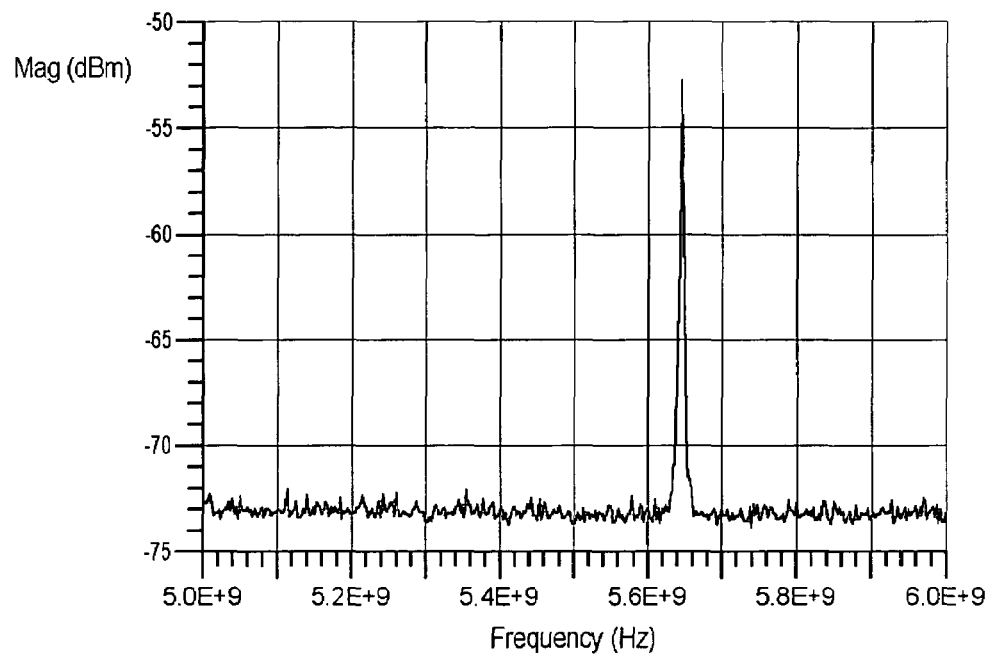
FIG. 7 is a graph representing an output spectrum of a 5.6-gHz oscillator implemented with the active inductor circuit of this invention.

1. As shown in FIGS. 6A, 6B, and 7, the oscillators can operate from 1 gHz to 5.6 gHz, depending on the chosen transistor length and biasing. The measured maximum frequency is 80% of the 7 gHz obtained in simulation. Here and below, the main discrepancy is believed caused by inaccuracies in the device models provided by the IC fabrication service provider and estimating the values of the parasitics based on vender testing data. FIG. 6A shows the output spectrum of a 2.6-gHz oscillator having a 50-Ω output driver. At the 2.59 gHz center frequency, the magnitude is –30.8 dBm, corresponding to the peak-to-peak voltage of 130 mV. FIG. 6B shows that the second harmonic of the oscillator is –67.1 dB. The attenuation of the output driver at 2.59 gHz is 17 dB. The third and higher harmonics are below the noise floor ($\approx$–73 dBm). FIG. 7 shows the output spectrum of a 5.6-gHz oscillator having a 50-Ω output driver. At the 5.65 gHz center frequency, the magnitude is –52.8 dBm, corresponding to a peak-to-peak voltage of 134 mV. The attenuation of the output buffer at 5.65 gHz is 39.3 dB. The second and higher harmonics are below the noise floor ($\approx$–73 dBm).

Figure 8A:
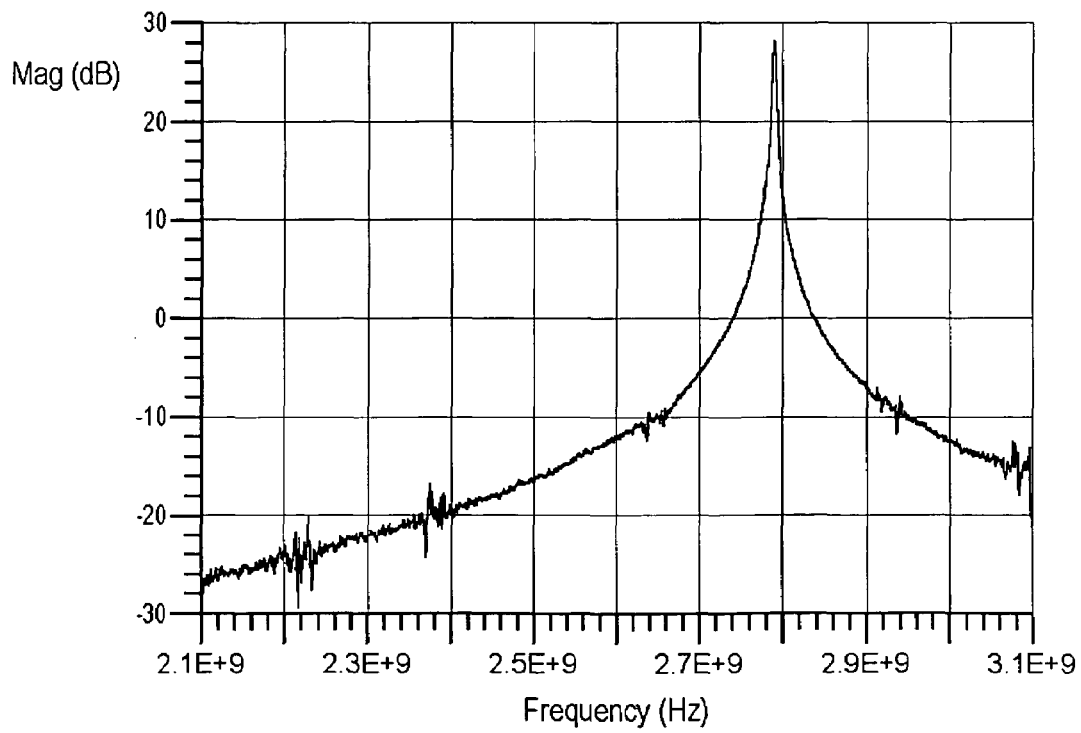
FIGS. 8A and 8B are graphs representing, respectively, the output spectrum and passband details of a 2.8-gHz bandpass filter implemented with the active inductor circuit of this invention.
Figure 8B:
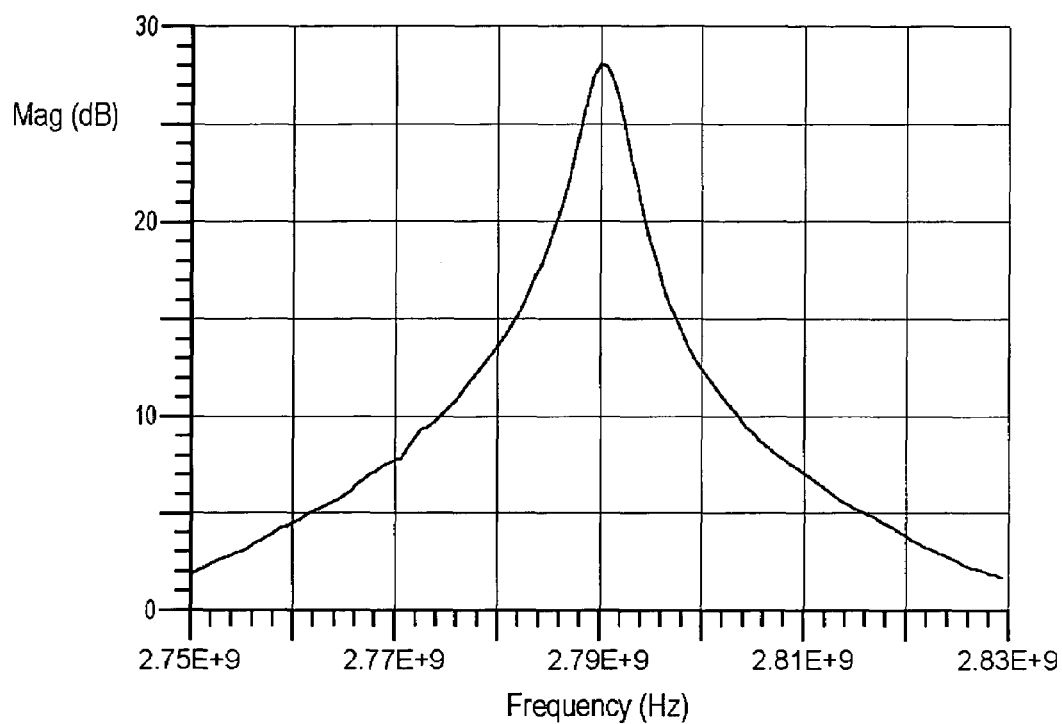
Figure 9A:
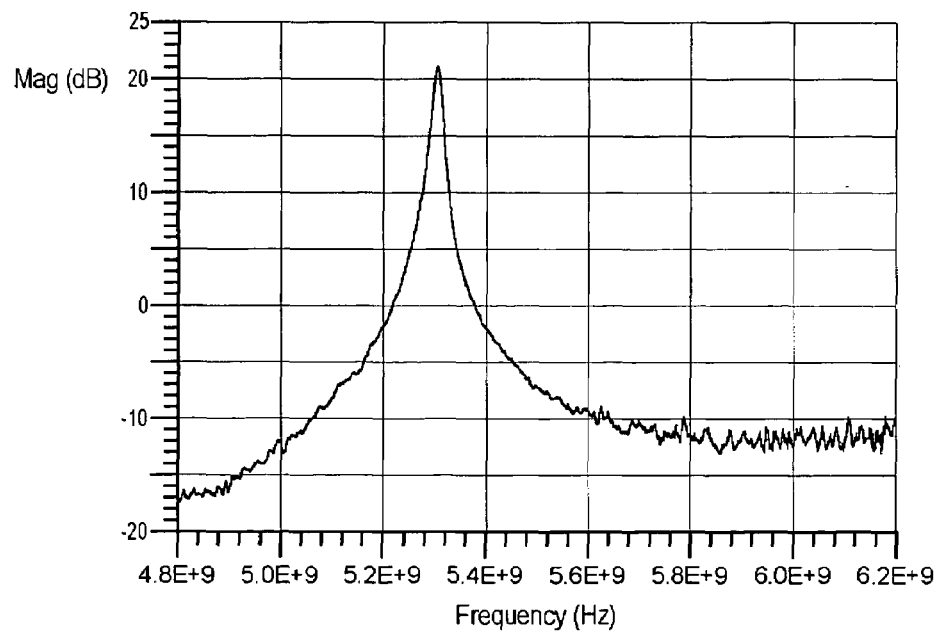
FIGS. 9A and 9B are graphs representing, respectively, the output spectrum and passband details of a 5.3-gHz bandpass filter implemented with the active inductor circuit of this invention.
Figure 9B:
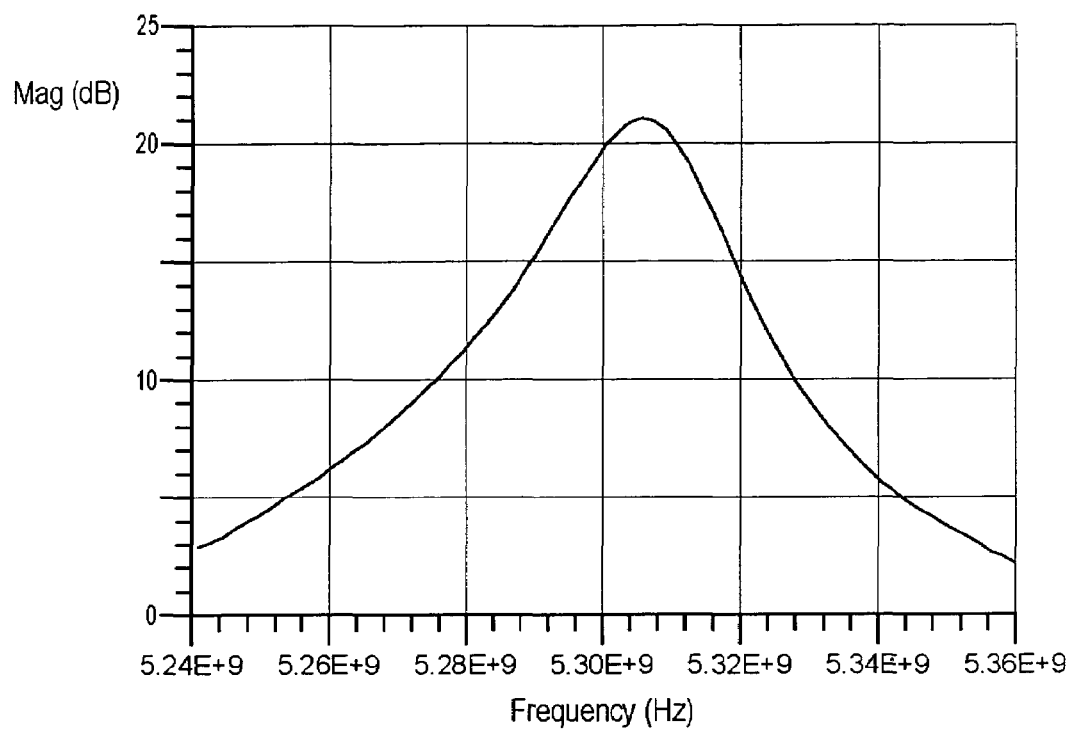

2. As shown in FIGS. 8A, 8B, 9A, and 9B, the bandpass filters were measured at 2.8 gHz and 5.3 gHz, with stable and repeatable quality factors up to 665. Higher Q values are possible, but the circuits become too sensitive to parameter variations to be useful. When Q is too high, a slight perturbation may render the circuit unstable. The filter performance agrees with the successful operation of the 2.6-gHz and 5.6-gHz oscillators that have the same bandpass filters at their core. FIGS. 8A and 8B show, respectively, the output spectrum and passband details of the 2.8-gHz bandpass filter after subtracting the effects of the input and output buffers. The center frequency $f_0$=2.79 gHz and Q=661. The mid-band gain is adjustable via external biasing. FIGS. 9A and 9B show, respectively, the output spectrum and passband details of the 5.3-gHz bandpass filter after subtracting the effects of the input and output buffers. The center frequency is $f_0$=5.31 gHz and Q=289. The mid-band gain is adjustable via external biasing. The stopband attenuation decreases at high frequencies because of the capacitive coupling within and between the devices.

3. The lowpass filters are operable from dc up to the gigaHertz range. The −3-dB cutoff frequency is 2–4 gHz depending on the chosen transistor lengths and biasing.

4. The nominal supply voltage was 1.8 V. The oscillators implemented with the active inductor circuit can operate at 1.5 V; but the operating frequency is reduced from 5.6 gHz to 4.3 gHz because of the reduced biasing currents. At 1.8 V, the maximum differential signal level (1-dB compression) is 260 mV.

5. All tuning handles, $I_F$, $I_S$, $V_F$, $V_Q$, work as expected.

The maximum operating frequency of the active inductor in TSMC 0.20-μm CMOS technology is around 5.8 gHz as demonstrated by the oscillators. In the second-order bandpass filter application, $Q_R$ of the active inductor equals that of the Q of the bandpass filter (defined as the ratio of center frequency to −3-dB bandwidth). Thus, $Q_R$ as high as 600 is stable and practical with the active inductor structure, in spite of various perturbations, such as from varying power supply, temperature, or light level. The modules can become unstable with Q-tuning, which implies that infinite or even negative Q values are achievable (but undesired, of course, in most cases).

Figure 1A:
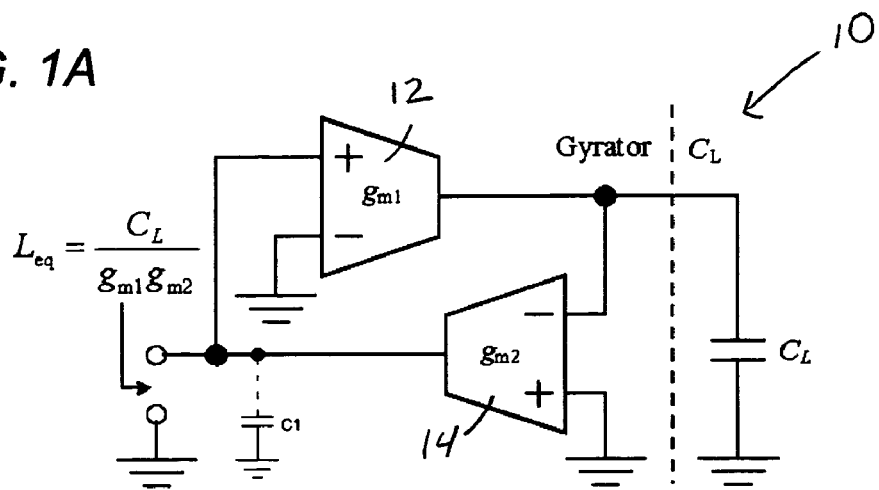
FIGS. 1A and 1B are schematic electrical diagrams representing respectively an active inductor circuit employing a gyrator and the equivalent electrical circuit thereof.
Figure 1B:
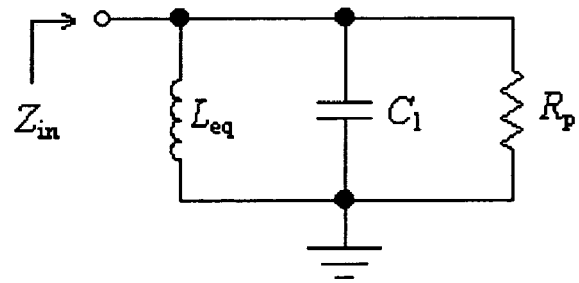
Figure 2A:
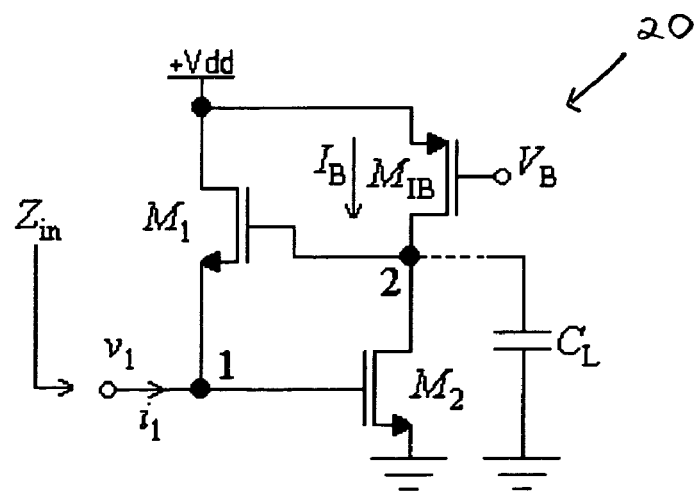
FIGS. 2A, 2B, and 2C are schematic electrical diagrams representing respectively an active inductor structure based on a regulated cascode circuit; the small signal equivalent circuit thereof; and the equivalent circuit for its input impedance $Z_{in}(s)$.
Figure 2B:
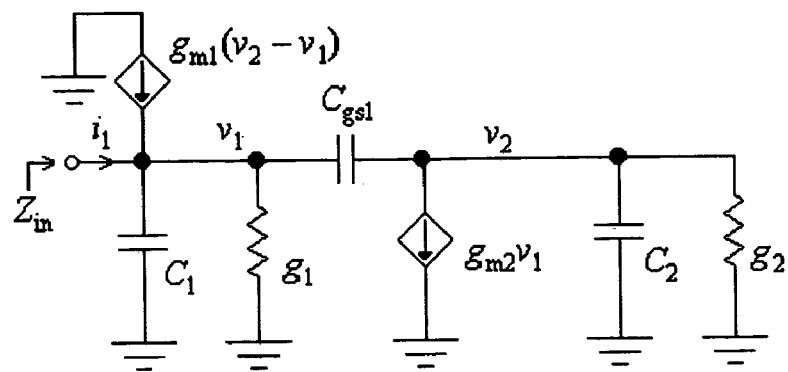
Figure 2C:
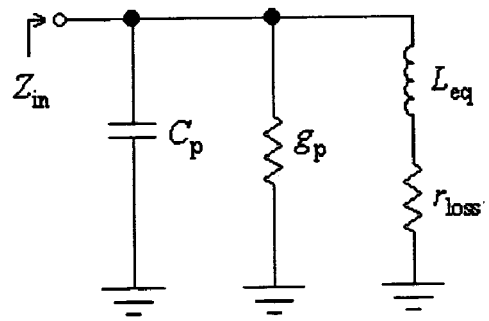

As described in the background of the invention, prior active inductor structures have particular problems that are solved by the active inductor structure of this invention. The solutions are summarized as follows:

1. The transistor count in the preferred embodiment is 3, and the transistors are all NMOS. In contrast, the transistor count in Karsilayan's circuit [14] is also 3, but two are PMOS, and only one is NMOS. The active inductor circuit of this invention exhibits a 40% improvement in operating frequency for a given fabrication technology, over Karsilayan's circuit, because the mobility of NMOS is 4–5 times greater than PMOS in submicron technologies. It is noted that the "regulated cascode" active inductor structure uses a minimum of two NMOS transistors (FIG. 2A), but its quality factor is very low (<10), and measures have to be taken to enhance Q, to implement functionalities such as narrow-band bandpass (frequency-selection) filters.

2. The active inductor circuit of this invention is very simple, and is able to operate in the mid 10-gHz range when implemented with 0.20-μm CMOS technology. The preferred gyrator has only one internal node (node 2) that is utilized to compensate the high losses of submicron MOSFETs. Therefore, the active inductor structure is highly efficient. Because of its simplicity, design for applications is very straightforward and the silicon layout very compact (typically around 30 μm×30 μm for bandpass filters including the surrounding double-guardrings).

3. The preferred active inductor circuit contains an intrinsic loss-compensating mechanism using only parasitic capacitors. It can be made lossless, that is, the quality factor can be infinite. The circuit can use minimum-length transistors with no penalty and, therefore, fully exploit the speed potential offered by modern submicron CMOS fabrication technologies.

4. No cascode structure is necessary to enhance Q because the circuit can self-compensate for the high loss of submicron MOSFETs. Therefore, the preferred circuit can operate at very low supply voltages (as low as 1.5 V with the current 0.20-μm CMOS technology, with the MOSFET threshold voltage $V_T$≈0.5 to 0.7 V).

5. The active inductor structure is fully compatible with standard digital CMOS technologies. No MiM capacitors and resistors are used. There is no need for adjusting the threshold voltage $V_T$ to operate at a low supply voltage.

We built an all-NMOS active inductor test chip to demonstrate the very compact layout, as follows: The total IC layout included ten circuit modules. The total IC die size is 2,650 μm×2,650 μm, including the bond-pad ring. The test chip included 5-gHz oscillator modules each with its associated three probe pads (center-to-center distance is equal to 150 μm). We also implemented an output driver driving a 50-Ω load and a 170-fF probe-pad capacitance. Its input capacitance is less than 1.0 femtoFarad. The Output driver also converts the differential signal into a single-ended output required for the test equipment.

In addition to a differential all-NMOS active inductor, the above-described circuit cores also contain auxiliary circuitry to implement their specific functions. The layouts of the cores are very simple and compact because the active inductor core is simple. This eases the layout design and verification, as well as operation at gigaHertz frequencies, because the interconnect capacitances are very low.

Figure 3A:
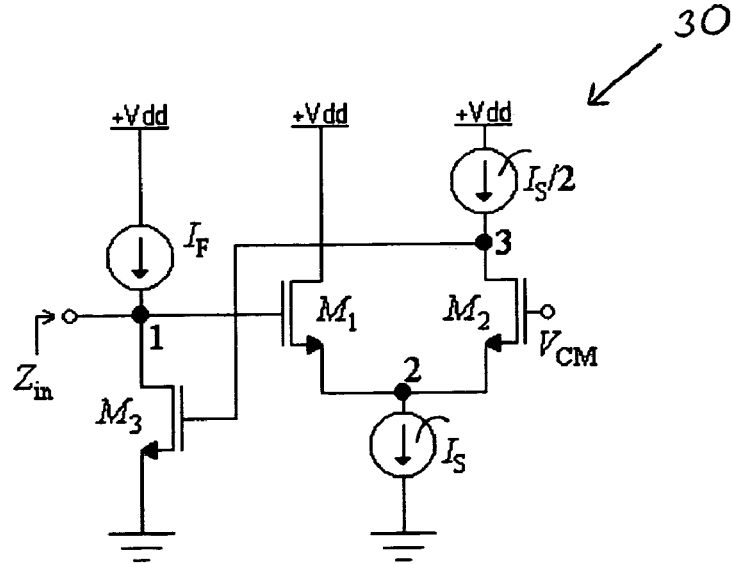
FIGS. 3A and 3B are schematic electrical diagrams representing respectively a simplified NMOS active inductor circuit and an all-transistor active inductor including tuning varactors.

To properly bias the transistors in FIG. 3A (an abstracted version of FIG. 3B), $I_F$ and $I_S$ should be roughly around 250 μA when the width/length of transistors $M_{1-3}$ is 3/0.2 microns. $I_F$ and $I_S$ should be approximately proportional to the transistors aspect ratios (width/length). However, the exact values of $I_F$ and $I_S$ are not necessary for obtaining an operative circuit, though they affect the circuit performances.

Figure 3B:
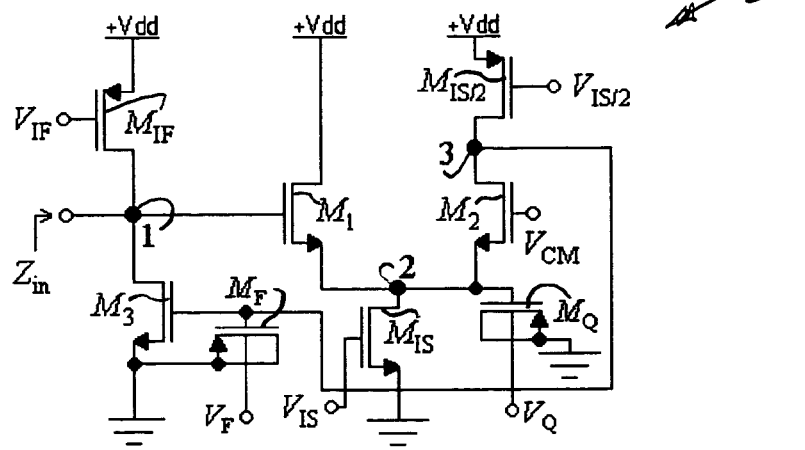

The selection of bias voltage $V_{CM}$ in FIGS. 3A and 3B is not critical to obtain an operative circuit, though it affects the circuit Q and $f_0$ to some extent. A suggested value for $V_{CM}$ is two-third (⅔) of the supply voltage $V_{dd}$, and it can be adjusted to obtain the desired performance.

In the rare cases when the circuit is unstable (Q<0) by design and cannot be corrected by adjusting the biasing, the $C_{gs}$ of $M_1$ in FIGS. 3A and 3B ($C_{gs1}$) can be augmented to provide compensation to the feedback loop, by appending a small capacitor between node 1 and node 2. This typically happens for longer-channel designs (transistor gate length >1 μm) or when the size of $M_Q$ in FIG. 3B is chosen to be overly large.

Set forth below is a list of references cited herein:

[1] Frank Op't Eynde, et al., "A Fully-Integrated Single-Chip SOC for Bluetooth," 2001 IEEE International Solid-State Circuits Conference, pp. 196–197.

[2] Apinunt Thanachayanont and Alison Payne, "A 3-V RF CMOS Bandpass Amplifier Using an Active Inductor," 1998 IEEE International Symposium on Circuits and Systems (ISCAS 1998), Vol. 1, pp. 440–443.

[3] Apinunt Thanachayanont, "A 1.5-V High-Q CMOS Active Inductor for IF/RF Wireless Applications," 2000 IEEE Asia-Pacific Conference on Circuits and Systems (APCCAS 2000), pp. 654–657.

[4] Apinunt Thanachayanont, "A 1.5-V CMOS Fully Differential Inductorless RF Bandpass Amplifier," 2001 IEEE International Symposium on Circuits and Systems (ISCAS 2001), pp. 49–52.

[5] Jhy-Neng Yang, et al., "A 1.75-gHz Inductor-less CMOS Low Noise Amplifier with High-Q Active Inductor Load," The 44th IEEE Midwest Symposium on Circuit and Systems, Vol. 2, pp. 816–819, 2001.

[6] Chao-Chih Hsiao, et al., "Improved Quality-Factor of 0.18-μm CMOS Active Inductor by a Feedback Resistance Design," IEEE Microwave and Wireless Components Letter, Vol. 12, No. 12, December 2002.

[7] U. Yodprasit and J. Ngarmnil, "Q-Enhancing Technique for RF CMOS Active Inductor," 2000 IEEE International Symposium on Circuits and Systems (ISCAS 2000), Vol. 5, pp. 589–592.

[8] Apinunt Thanachayanont and S. Sae Ngow, "Class AB VHF CMOS Active Inductor," The 45$^{th}$ Midwest Symposium on Circuits and Systems, Vol. 1, pp. 64–67, 2002.

[9] Choon Haw Leong and Gordon W. Roberts, "A Sixth-Order UHF Bandpass Filter Using Silicon Bipolar Active Inductors," 1998 IEEE International Symposium on Circuits and Systems (ISCAS 1998), Vol. 1, pp. 127–130.

[10] Yue Wu, Mohammed Ismail, Hakan Olsson, "A Novel CMOS Fully Differential Inductorless RF Bandpass Filter," 2000 IEEE International Symposium on Circuits and Systems (ISCAS 2000), Vol. 4, pp. 149–152.

[11] Markus Grözing, Andreas Pascht, Manfred Berroth, "A 2.5 V CMOS Differential Active Inductor with Tunable L and Q for Frequencies up to 5 gHz," 2000 IEEE Radio Frequency Integrated Circuits (RFIC) Symposium, pp. 271–274.

[12] R. Akbari-Dilmaghani, A. Payne and C. Toumazou, "A High Q RF CMOS Differential Active Inductor," 1998 IEEE International Conference on Electronics, Circuits and Systems (ICECS 1998), Vol. 3, pp. 157–160.

[13] K. H. Chiang, et al., "A Modular Approach for High Q Microwave CMOS Active Inductor Design," The 7$^{th}$ IEEE International Conference on Electronics, Circuits and Systems (ICECS 2000), Vol. 1, pp. 41–44.

[14] Aydin Karsilayan and Rolf Schaumann, "A High-Frequency High-Q CMOS Active Inductor with DC Bias Control," The 43$^{rd}$ IEEE Midwest Symposium on Circuits and Systems, pp. 486–489, 2000.

[15] Haiqiao Xiao and Rolf Schaumann, "Very-High-Frequency Lowpass Filter Based on a CMOS Active Inductor," 2002 IEEE International Symposium on Circuits and Systems (ISCAS 2002), Vol. 2, 2002, pp. 1–4.

[16] Haiqiao Xiao and Rolf Schaumann, "A Low-Voltage Low-Power CMOS 5-gHz Oscillator Based on Active Inductors," 9$^{th}$ IEEE International Conference on Electronics, Circuits and Systems (ICECS2002), Dubrovnik, Croatia, September 2002.

It will be obvious to those having skill in the art that many changes may be made to the details of the above-described embodiments without departing from the underlying principles of the invention. The scope of the present invention should, therefore, be determined only by the following claims.

We claim:

1. An active inductor circuit implemented in CMOS semiconductor technology and comprising:
   an input node;
   a non-inverting transconductor circuit connected to the input node;
   an inverting transconductor circuit connected to an output node of the non-inverting transconductor circuit and connected to the input node in a feedback configuration;
   the inverting transconductor circuit comprising an NMOS transistor; and further wherein:
   the non-inverting transconductor circuit comprises a differential pair of NMOS transistors having a first gate terminal forming the input node, a second gate terminal connected to a bias source, and a drain terminal forming the said output node, so that the signal path from input node to output node traverses exclusively NMOS devices.

2. An active inductor circuit according to claim 1 wherein the NMOS devices are sub-micron MOSFET devices.

3. An active inductor circuit according to claim 2 wherein the MOSFET devices in the differential pair are approximately the same size.

4. An active inductor circuit according to claim 3 wherein the MOSFET devices in the differential pair have approximately the same biasing.

5. An active inductor circuit according to claim 1 wherein: the non-inverting transconductor circuit comprises a differential pair of NMOS transistors; the inverting transconductor circuit comprises a single NMOS transistor; and the differential pair followed by the single NMOS transistor from the signal path of the active inductor circuit.

6. An active inductor circuit according to claim 5 wherein the differential pair of NMOS transistors and the single NMOS transistor all have W/L sizes of approximately 3/0.2 microns.

7. An active inductor circuit according to claim 5 and further comprising:
   a first variable capacitor coupled to the inverting transconductor circuit for tuning the active inductor circuit, the variable capacitor consisting of a PMOS transistor connected in a varactor configuration.

8. An active inductor circuit according to claim 7 and further comprising:
   a second variable capacitor coupled to the noninverting transconductor circuit for tuning the active inductor circuit, the second variable capacitor consisting of a second PMOS transistor connected in a varactor configuration.

9. A method of tuning a high-frequency, CMOS implemented active inductor circuit, the method comprising the steps of:
   providing an input node and a non-inverting transconductor circuit connected to the input node;
   deploying an inverting transconductor circuit connected to an output of the non-inverting transconductor circuit and connected to the input node in a feedback configuration so as to form a gyrator circuit;
   providing a first variable capacitor coupled to the inverting transconductor circuit; and
   tuning the active inductor circuit by varying a capacitance of the variable capacitor.

10. A method of tuning an active inductor circuit according to claim 9 and including:
    implementing the inverting transconductor circuit as an NMOS transistor; and
    implementing the variable capacitor as a PMOS transistor; wherein the PMOS transistor is connected to the gate of the NMOS transistor.

11. A method of tuning an active inductor circuit according to claim 10 wherein said varying the capacitance of the variable capacitor comprises adjusting a bias voltage applied to the substrate of the PMOS transistor.

12. A method of tuning an active inductor circuit according to claim 10 further comprising:
providing a second variable capacitor coupled to the non-inverting transconductor circuit; and
tuning the active inductor circuit by varying a capacitance of the second variable capacitor.

13. A method of tuning a high-frequency, CMOS implemented active inductor circuit, the method comprising the steps of:
providing an input node and a non-inverting transconductor circuit connected to the input node;
providing an inverting transconductor circuit connected to an output of the non-inverting transconductor circuit and connected to the input node in a feedback configuration so as to form a gyrator circuit; wherein the non-inverting transconductor circuit comprises a differential pair of NMOS transistors;
providing a first variable capacitor coupled to the differential pair of NMOS transistors; and
tuning the active inductor circuit by varying a capacitance of the first variable capacitor.

14. A method of tuning an active inductor circuit according to claim 13 wherein the first variable capacitor is connected to a common source node of the differential pair.

15. A method of tuning an active inductor circuit according to claim 14 including implementing the variable capacitor as a PMOS transistor.

16. A method of tuning an active inductor circuit according to claim 15 wherein said varying the capacitance of the variable capacitor comprises adjusting a bias voltage $V_Q$ applied to the substrate of the PMOS transistor.

17. An active inductor circuit implemented in CMOS semiconductor technology and comprising:
a non-inverting transconductor circuit comprising first and second NMOS transistors arranged in a differential pair configuration; a gate terminal of the first NMOS transistor defining an input node, and a drain terminal of the second NMOS transistor defining an output node; and
an inverting transconductor circuit comprising a third NMOS transistor connected to the output node of the NMOS differential pair and connected to the input node in a feedback configuration; and wherein
a signal path from the input node to the output node traverses exclusively NMOS devices.

18. A method of tuning a CMOS active inductor circuit fabricated in accordance with claim 17, the tuning method comprising the steps of:
providing a first bias current to the third NMOS transistor; and
varying the first bias current, thereby adjusting the operating characteristics of the active inductor circuit.

19. A method of tuning a CMOS active inductor circuit according to claim 18 and further comprising:
providing a second bias current to the differential pair of NMOS transistors; and
varying the second bias current, thereby adjusting the operating characteristics of the active inductor circuit.

20. A method of tuning a CMOS active inductor circuit according to claim 18 and further comprising:
adding a first capacitive element to the feedback path between the output node and the third NMOS transistor; and
varying a capacitance of the first capacitive element, thereby adjusting the operating characteristics of the active inductor circuit.

21. A method of tuning a CMOS active inductor circuit according to claim 20 wherein the first capacitive element comprises a varactor.

22. A method of tuning a CMOS active inductor circuit according to claim 20 wherein the first capacitive element consists of a PMOS transistor arranged with its gate connected to the said output node.

23. A method of tuning a CMOS active inductor circuit according to claim 22 wherein said varying the capacitance of the first capacitive element comprises varying a bias voltage applied to a substrate of the PMOS transistor.

24. A method of tuning a CMOS active inductor circuit according to claim 18 and further comprising:
adding a capacitive element to a common source node of the NMOS differential pair; and
varying a capacitance of the capacitive element, thereby adjusting the operating characteristics of the active inductor circuit.

25. A method of tuning a CMOS active inductor circuit according to claim 24 wherein the capacitive element comprises a PMOS transistor arranged to form a varactor.

26. A method of tuning a CMOS active inductor circuit according to claim 25 wherein said varying the capacitance of the capacitive element comprises varying a bias voltage applied to a substrate of the PMOS transistor.

27. A method of tuning a CMOS active inductor circuit according to claim 18 and further comprising:
adding a first capacitive element to the feedback path between the output node and the third NMOS transistor; and
adjusting a capacitance of the first capacitive element, thereby adjusting the operating characteristics of the active inductor circuit;
adding a second capacitive element to a common source node of the NMOS differential pair; and
adjusting a capacitance of the second capacitive element, thereby adjusting the operating characteristics of the active inductor circuit.

28. A method of tuning a CMOS active inductor circuit according to claim 27 wherein both the first and second capacitive elements are PMOS transistors arranged in a varactor configuration.

29. A method of tuning a CMOS active inductor circuit according to claim 18 including tuning the biasing current to the noninverting transconductor, thereby adjusting the operating characteristics of the active inductor circuit (Q).

30. A method of tuning a CMOS active inductor circuit according to claim 18 including tuning the biasing current to the inverting transconductor, thereby adjusting the operating characteristics of the active inductor circuit ($f_o$).

* * * * *

UNITED STATES PATENT AND TRADEMARK OFFICE
CERTIFICATE OF CORRECTION

PATENT NO.      : 7,042,317 B2
APPLICATION NO. : 10/937,062
DATED           : May 9, 2006
INVENTOR(S)     : Haiqiao Xiao, Rolf Schumann and W. Robert Daasch It is certified that error appears in the above-identified patent and that said Letters Patent is hereby corrected as shown below:

Title page, item [57]
Line 5 of the Abstract, after "node," insert --and--.

Column 1, Line 39, replace "have a larger induction values, high" with --have larger induction values and high--.

Column 2, Line 24, replace "$g_{mi}$" with --$g_{ml}$--.

Column 2, Line 47, replace "$\leqq$" with --$\leq$--.

Column 3, Line 40, replace "$L$" with --$L_{eq}$--.

Column 4, Line 42, replace "$\leqq$" with --$\leq$--.

Column 4, Line 54, replace "a" with --an--.

Column 5, Line 67, replace "FIG." with --FIGS.--.

Column 7, line 9, replace "$\leqq$" with --$\leq$--.

Column 8, Line 40, replace "-$\omega^2 S$" with -- -$\omega^2 s$--.

UNITED STATES PATENT AND TRADEMARK OFFICE
CERTIFICATE OF CORRECTION

PATENT NO. : 7,042,317 B2
APPLICATION NO. : 10/937,062
DATED : May 9, 2006
INVENTOR(S) : Haiqiao Xiao, Rolf Schumann and W. Robert Daasch It is certified that error appears in the above-identified patent and that said Letters Patent is hereby corrected as shown below:

In Column 9, Line 37, after "this", insert --is--.

In Column 12, Line 45, replace "two third" with --two-thirds--.

In Column 13, Line 24, replace "Hakan" with --Håkan--.

In Column 14, Line 27, replace "from" with --form--.

Signed and Sealed this

Nineteenth Day of September, 2006

JON W. DUDAS
*Director of the United States Patent and Trademark Office*